United States Patent [19]

Berger et al.

[11] 4,005,365
[45] Jan. 25, 1977

[54] VOLTAGE COMPARATOR AND INDICATING CIRCUIT

[75] Inventors: Robert L. Berger; William H. Hailey, both of Kansas City; George Mallick, Jr., Ellisville; Donald H. Mannbeck, St. Charles; Wilber J. Weight, Lee's Summit, all of Mo.

[73] Assignee: Western Electric Company, Inc., New York, N.Y.

[22] Filed: Mar. 26, 1975

[21] Appl. No.: 562,322

[52] U.S. Cl. .................. 324/133; 307/235 T; 324/51; 340/248 A

[51] Int. Cl.² ............ G01R 31/02; G01R 19/14; G01R 19/16

[58] Field of Search ......... 324/51, 72.5, 122, 133, 324/149; 340/248 A, 248 B, 248 C; 307/235 R, 235 T

[56] References Cited
UNITED STATES PATENTS

| | | | |
|---|---|---|---|
| 2,848,685 | 8/1958 | Mondschein | 324/122 |
| 3,021,514 | 2/1962 | Regis et al. | 324/133 X |
| 3,141,107 | 7/1964 | Wasserman | 324/122 UX |
| 3,457,560 | 7/1969 | McKinley | 340/248 C |
| 3,525,939 | 8/1970 | Cartmell | 324/72.5 X |
| 3,544,983 | 12/1970 | Wallace et al. | 340/248 A |
| 3,624,503 | 11/1971 | Barrowcliff | 324/133 |
| 3,673,588 | 6/1972 | Riff | 340/248 A |
| 3,769,577 | 10/1973 | Schnur et al. | 340/248 C X |
| 3,805,155 | 4/1974 | Tsuda et al. | 324/133 |
| 3,838,339 | 9/1974 | Brandt | 324/133 |

FOREIGN PATENTS OR APPLICATIONS

| | | | |
|---|---|---|---|
| 9,737 | 4/1968 | Japan | 324/133 |
| 1,268,183 | 3/1972 | United Kingdom | 324/133 |

OTHER PUBLICATIONS

Czechlewski et al. *Pulse and Level Detector Circuits*, Western Electric Technical Digest No. 35, July 1974, pp. 11-13.

*Primary Examiner*—Gerard R. Strecker
*Attorney, Agent, or Firm*—W. O. Schellin

[57] ABSTRACT

A device including a voltage indicator circuit has the capability of indicating positive, neutral and negative voltages with respect to a reference voltage. Three indicator circuits are mounted on a single substrate. Each indicator circuit energizes a respective light emitting diode to indicate whether a voltage applied to a probe is positive, neutral or negative with respect to a reference voltage. The reference voltage is applied to a ground or reference terminal on the circuit. An alternating voltage is indicated by rendering effective all three light-emitting diodes. An open circuit can be ascertained by the absence of a positive signal from all the diodes.

7 Claims, 4 Drawing Figures

VOLTAGE COMPARATOR AND INDICATING CIRCUIT

BACKGROUND OF THE INVENTION

1. Field of the Invention

This invention relates generally to electrical indicating circuits and devices. More particularly, this invention relates to voltage indicating circuits that are compactly housed in a useful package.

2. Description of the Prior Art

In the prior art, various voltage and logic state indicating circuits include those that are specially adapted to sense binary logic levels. Devices including this type of circuit may or may not include change of state indicating means. Other circuits and their respective devices are used to indicate voltage levels. Some of the latter devices indicate either a positive or a negative voltage with respect to ground potential. Other voltage indicating devices have the capability of showing discrete levels of voltage. Of the devices which have a positive and a negative voltage indication with respect to a ground reference potential, an indication from both the positive and negative indicator show an AC potential as being measured.

While prior art probes are generally capable of indicating high and low voltages, some prior art probes cannot unambiguously distinguish between test points being at ground potential and those points not connected to its test circuit. Where a test circuit has means for positively indicating an open circuit, the test circuit is usually complex.

SUMMARY OF THE INVENTION

It is, therefore, an object of the present invention to provide a voltage indicator circuit with a definite indication of positive, neutral and negative potentials with respect to a reference potential.

It is another object of the invention to provide an indicator circuit with positive indication over an entire range of test voltages, thereby unambiguously indicating an open circuit by the complete absence of any voltage indication.

It is a further object to provide a simple and inexpensive circuit and an associated housing to combine one or more of the desired indicator circuits in a piece of apparatus.

Consequently, in accordance with the invention, a device for indicating voltage ranges with respect to a reference voltage includes a first circuit, coupled to an input terminal and to a reference terminal, for indicating a range of voltages appearing at the input terminal which are greater than a first voltage, the first voltage being positive with respect to the reference voltage. A second circuit is coupled to the input terminal and to the reference terminal for indicating a range of voltages appearing at the input terminal which are less than a second voltage, the second voltage being negative with respect to the reference voltage. A third circuit is coupled to the input terminal and to the reference terminal for indicating a range of voltages appearing at the input terminal which includes the first and second voltages.

BRIEF DESCRIPTION OF THE DRAWING

The present invention is best understood in conjunction with the appended drawing wherein.

DETAILED DESCRIPTION

The Device in General

Figure 1:
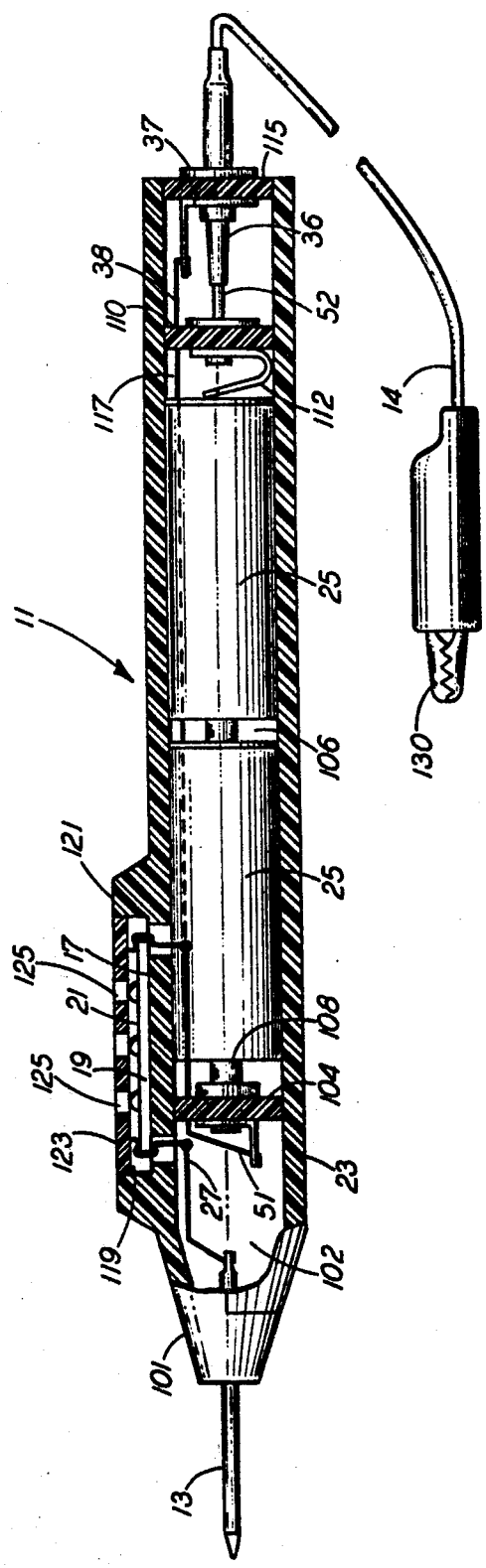
FIG. 1 is a voltage probe in accordance with an aspect of the present invention.

Referring now to FIG. 1 there is shown a voltage indicator or a probe device which is designated generally by the numeral 11. The device 11 incorporates the present invention and is described as a specific and preferred embodiment thereof.

The device 11 includes an elongated, cylindrical housing 12. A contact or probe 13 extends from one end of the housing 12. A ground or reference lead 14 is attached to the other end of the housing 12.

The housing 12 is characterized by a seat 17 located on the periphery of the housing near the probe 13. The seat supports a substrate 19. The substrate 19, in turn, supports substantially all working elements of an indicating circuit 21 which is shown schematically in greater detail in FIG. 2.

Because of the convenient location of the circuit 21 on the outside of a substantially cylindrical wall 23 of the housing 12, the cylindrical volume within the housing 12 is used to contain two batteries 25 which are connected in series to supply a battery voltage to the circuit 21, as will be described hereinafter. The proximity of the indicating circuit 21 to the probe 13 permits the probe, as well as the indicating circuit, to remain within the field of view of an operator. The convenience of handling the device while viewing probe tested voltage results is facilitated greatly by various aspects of the present invention.

The Indicating Circuit

Figure 2:
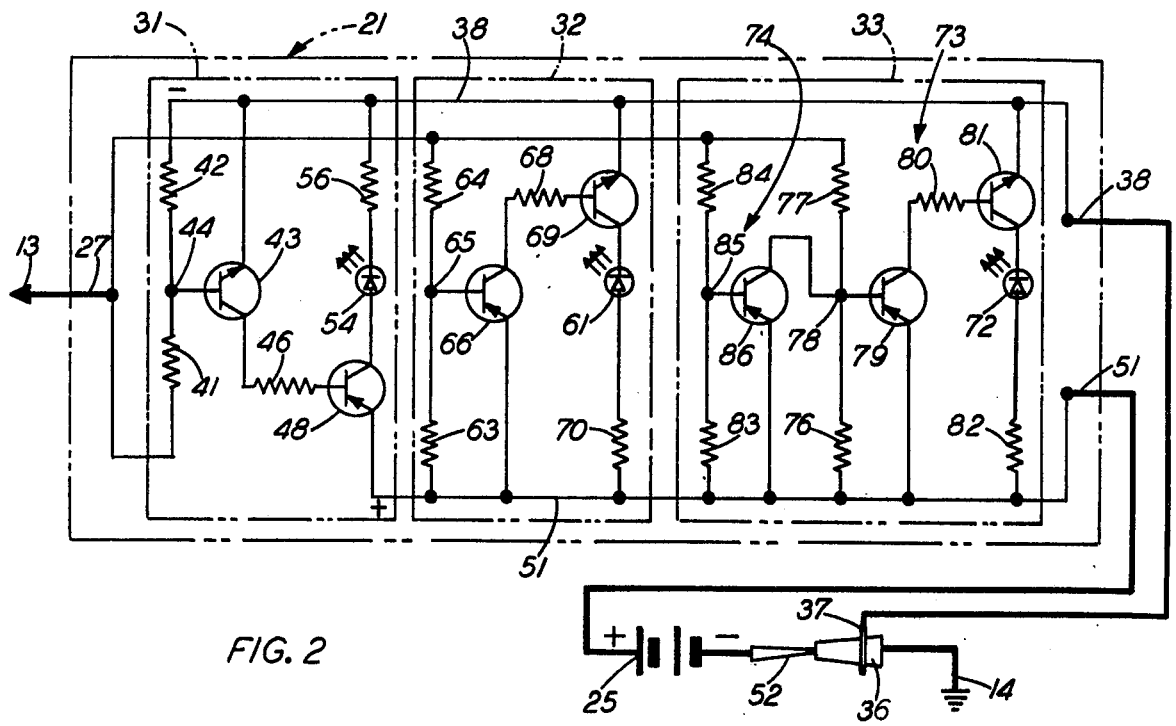
FIG. 2 is a schematic diagram of the indicating circuit housed in the voltage probe of FIG. 1.

Referring now to FIG. 2 there is shown a schematic diagram of the indicating circuit 21. The entire indicating circuit 21 is supported on the substrate 19 which is schematically shown by the large boxed-in area of FIG. 2. The probe 13 is coupled to the circuit 21 through an input terminal 27. The input terminal 27 is coupled to three indicating circuits 31, 32 and 33 which are voltage sensitive. When the device 11 is in operation, the ground or reference lead 14 is attached to a reference point on a sample circuit to be tested (not shown) and the probe 13 touches any other point on the sample circuit. The reference potential from the lead 14 is applied through a connector plug 36 to a connector socket 37 to appear at a reference terminal 38 of the indicating circuit 21. The applied voltage at the probe 13 similarly appears on the input terminal 21.

The indicating circuit 31 is referred to as the positive voltage indicating circuit. Resistors 41 and 42 form a voltage divider between the input terminal 27 and the reference terminal 38. An NPN transistor 43 is coupled with its base to a node 44 between the resistors 41 and 42. The collector of the transistor 43 is coupled through a resistor 46 to the base of a PNP transistor 48. The transistor 48 acts as a final switching transistor for the indicating circuit 31.

To perform the switching function, the emitter of the transistor 48 is coupled through a battery terminal 51 to the positive terminal of the battery 25. The negative terminal of the battery is coupled through a pin 52 to the reference terminal 38 when the connector plug 36 is inserted into the socket 37. Thus, when the device 11 is not in use and the ground or reference lead 14 is disconnected from the device 11, the battery 25 is disconnected from the circuit 21 by a discontinuity between the negative battery terminal and the reference terminal 38.

Again, in reference to the circuit 31, the positive voltage from the battery 25 is applied through the battery terminal 51 to the emitter of the transistor 48. A collector of the transistor 48 is coupled to a light-emitting diode 54 which, in turn, is coupled through a resistor 56 to the reference terminal 38 of the circuit 21.

The resistors 41 and 42 of the circuit 31 are selected such that when a first predetermined positive voltage with respect to the reference voltage on the terminal 38 is impressed on the probe 13 and appears on the input terminal 27, transistor 43 starts to conduct. When the transistor goes into conduction, or turns on, the base voltage of the transistor 48 drops and the transistor 48 turns on also. The light-emitting diode 54, which performs an indicating function, is then energized by the battery 25. Consequently, the diode 54 indicates a positive voltage appearing on the probe 13. The precise voltage at which the diode 54 will be energized is, of course, determined by the values of the resistors 41 and 42. But once the diode 54 has been energized, an increasing voltage on the probe 13 drives the transistors 43 and 48 into an increased state of conduction. Consequently, the diode 54 will remain turned on as the voltage under probe 13 increases.

The indicating circuit 32 functions similarly to the circuit 31 inasmuch as it activates an indicator, a light-emitting diode 61, in response to a range of voltages applied to the probe 13. The voltages which activate the diode 61, however, fall in a range of voltages which are less than a second predetermined voltage. This second voltage is selected to be more negative than the reference voltage appearing on the terminal 38. The circuit 32 is consequently referred to as the negative voltage or low level indicator circuit.

In the low level circuit 32, two resistors 63 and 64 are coupled in series to form a voltage divider between the input terminal 27 and the battery terminal 51. A node 65 between the resistor 63 and 64 is coupled to the base of a PNP transistor 66. The emitter of the transistor 66 is coupled to the battery terminal 51 and the collector of the transistor 66 is coupled through a resistor 68 to the base of an NPN transistor 69. The transistor 69 functions as a final switch having its emitter coupled through the reference terminal 38 and its collector to the cathode of the diode 61 which, in turn, is coupled through a resistor 70 to the battery terminal 51.

Again, the circuit 32 utilizes the battery 25 to power the diode 61 in a manner similar to that in which the diode 54 in the circuit 31 is powered, In addition thereto, however, the battery power on the battery terminal 51 biases the turn-on voltage of the transistor 66, as it appears at the node 65, toward the positive by the amount of voltage on the battery 25. Thus, the value of the resistors 63 and 64 have to be chosen to take into account the bias by the amount of the voltage of the battery 25.

The indicating circuit 33 differs from the function of the prior circuits 31 and 32 in that its indicator, a light-emitting diode 72, is rendered effective or turned on in response to a range of voltages bounded on an upper and lower end by predetermined upper and lower threshold voltages respectively. Thus, the circuit 33 is referred to also as the reference range, neutral or middle range indicating circuit. The circuit 33, consequently, consists of two subcircuits. One of the subcircuits; an indicator activating circuit 73, functions in a manner similar to the circuits 31 and 32, activating the diode 72. Another subcircuit, an inhibiting circuit 74, deactivates the diode 72 when a voltage at the probe 13 falls below the predetermined lower threshold voltage.

In the activating subcircuit 73, a pair of resistors 76 and 77 are, again, coupled in series between the battery terminal 51 and the input terminal 27. Like in the circuit 32, a node 78 between the resistors 76 and 77 is coupled to the base of a PNP transistor 79. The emitter of the transistor 79 is also coupled to the battery terminal 51 and the collector is coupled through a resistor 80 to the base of an NPN transistor 81. The emitter of the transistor 81 is coupled directly to the reference terminal 38. The collector of the transistor 81 is coupled to a series connection between the diode 72 and a resistor 82 to the battery terminal 51.

When the voltage at the node 78 of the voltage divider formed by the resistor 76 and 77 falls below a certain voltage with respect to the voltage on the battery terminal 51, the transistor 79 is rendered conductive to put a positive voltage on the base of the transistor 81. This renders the transistor 81 conductive and activates the diode 72 to give a visual indicating signal.

The inhibiting circuit 74 is formed by a voltage divider including resistors 83 and 84 which are coupled in series and to the battery terminal 51 and to the input terminal 27, respectively. A node 85 of the voltage divider formed by the resistors 83 and 84 is coupled to the base of a PNP transistor 86. The emitter of the transistor is coupled to the battery terminal 51 and the collector is coupled to the node 78 of the activating circuit 73. The values of the resistors 83 and 84 are chosen to render the transistor 86 conductive when a voltage at the probe 13 has reached or has fallen below the lower threshold voltage. This places the voltage appearing at the battery terminal 51 on the base of the transistor 79 of the activating circuit 73 and in response thereto, the diode 72 is deactivated.

In the circuit 33, the values of the voltage dividing resistors 76 and 77 are selected to place the upper threshold voltage at which the diode 72 is activated at a voltage higher than the first voltage of the positive voltage indicating circuit 31. Similarly, the values of the voltage dividing resistors 83 and 84 are chosen to place the lower threshold voltage at a voltage below the second voltage of the negative voltage indicating circuit 32. In chosing the values of the resistors 76, 77, 83 and 84, a shift of the threshold voltages toward the positive side of the voltage scale by the amount of the battery bias voltage is considered.

Figure 4:
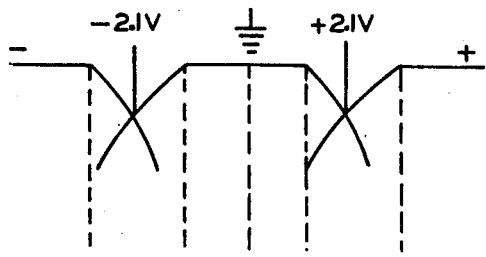
FIG. 4 is a functional diagram of the circuit of FIG. 2.

Referring to FIG. 4, the light-emitting diodes 54, 61 and 72 do not go from a full off to a full on condition, as a voltage applied at the probe 13 gradually increases or decreases. The upper and lower threshold voltages are, therefore, chosen so that at an approximate 2.1 positive or negative volts from the reference voltage appearing on the terminal 38, two of the diodes 54, 61 and 72 are giving off light at approximately equal brightness. As shown in FIG. 4, at voltages greater than a positive 3.5 volts or less than a negative 3.5 volts, the diode 72 is expected to be deactivated. These voltages approximate the upper and lower threshold voltages, respectively. At about 2.1 volts on the positive side of the reference voltage on the terminal 38, both the diode 54 and the diode 72 will be activated approximately equal but less than completely. In the range about the reference voltage, from about +0.7 volts positive to about −0.7 volts with respect to the reference voltage, only the diode 72 will be fully activated. Thereafter, on the negative side of the reference voltage, follows a range of transition wherein the diode 72 is gradually becoming deactivated and the diode 61 is becoming activated. At a negative 2.1 volts with respect to the reference voltage, both diodes 61 and 72 are approximately equally activated. In the range of less than −3.5 volts with respect to the reference voltage, only the diode 61 is fully activated.

ALTERNATE EMBODIMENT OF THE CIRCUIT 32

Figure 3:
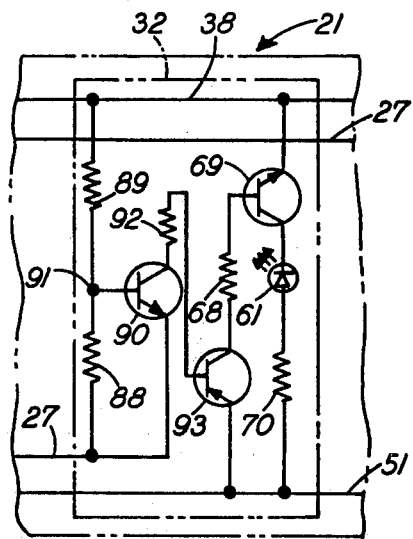
FIG. 3 is a schematic diagram of an alternate embodiment of the circuit of FIG. 2.

Referring now to FIG. 3, there is shown a portion of the circuit 21, and in particular, a portion which represents, an alternate embodiment of the circuit 32 in FIG. 2. A voltage divider shown in FIG. 3 includes resistors 88 and 89 which are coupled in series between an extension of the input terminal 27 and reference terminal 38, such that the resistor 88 is coupled to the input terminal 27 and the resistor 89 is coupled to the reference terminal 38. An NPN transistor 90 is coupled with its base to a node 91 between the two resistors 88 and 89. The emitter of the transistor 90 is coupled directly to the input terminal 27. The collector of the transistor 90 is coupled through a resistor 92 to the base of the PNP transistor 93. The transistor 93 is coupled identically to the transistor 66 through the resistor 68 to the base of the transistor 69. The indicator subcircuit including the resistor 70, the diode 61 and the transistor 69 functions identical to the corresponding subcircuit of the preferred embodiment described with respect to FIG. 2. As a voltage applied to the probe 13 decreases the second predetermined voltage, the light-emitting diode 61 is activated.

The alternate embodiment described with respect to FIG. 3, illustratively shows one of the changes which can be made to the circuit 21 without departing from the scope of the present invention. For instance, in FIG. 3, in selecting the resistor values of resistors 88 and 89 to activate the diode 61 at or below the second voltage, the bias voltage of the battery 25 need not be considered any longer. Thus, the resistor values now reflect the true second predetermined voltage at which the transistors 90 and 93 are rendered conductive to activate the low voltage indicator diode 61.

REPRESENTATIVE CIRCUIT VALUES

In the above-described circuit, represented by FIG. 2, the following components are preferred to yield approximately the characteristic of the device 11, as shown in FIG. 4.

| Circuit 31 | | |
|---|---|---|
| | Resistor 41 | 160K ohms |
| | Resistor 42 | 43K ohms |
| | Resistor 46 | 750 ohms |
| | Resistor 56 | 100 ohms |
| | Transistor 43 | NPN small signal transistor |
| | Transistor 48 | PNP small signal transistor |
| | Diode 54 | Monsanto MV50 light-emitting diode |
| Circuit 32 | | |
| | Resistor 63 | 13K ohms |
| | Resistor 64 | 100K ohms |
| | Resistor 68 | 750 ohms |
| | Resistor 70 | 100 ohms |
| | Transistor 66 | PNP small signal transistor |
| | Transistor 69 | NPN small signal transistor |
| | Diode 61 | Monsanto MV50 light-emitting diode |
| Circuit 33 | | |
| | Resistor 83 | 14K ohms |
| | Resistor 84 | 100K ohms |
| | Resistor 76 | 360K ohms |
| | Resistor 77 | 100K ohms |
| | Resistor 80 | 750 ohms |
| | Resistor 82 | 100 ohms |
| | Transistor 79 | PNP small signal transistor |
| | Transistor 81 | NPN small signal transistor |
| | Transistor 86 | PNP small signal transistor |
| | Diode 72 | Monsanto MV50 light-emitting diode |
| The Alternate Circuit 32 of FIG. 3 | | |
| | Resistor 68 | 750 ohms |
| | Resistor 70 | 100 ohms |
| | Resistor 88 | 43K ohms |
| | Resistor 89 | 160K ohms |
| | Resistor 92 | 33K ohms |
| | Transistor 69 | NPN small signal transistor |
| | Transistor 90 | NPN small signal transistor |
| | Transistor 93 | PNP small signal transistor |
| | Diode 61 | Monsanto MV50 light-emitting diode |

Referring back to FIG. 1, these components are combined on a single ceramic substrate 19. The resistors and interconnecting conductors are formed by conventional thick film technology. The resistors are bonded to gold pads formed on the substrate in a conventional manner. The junction contacts of the transistors are wire bonded in a conventional manner to the respective circuit nodes on the substrate 19. The commercially available light-emitting diodes are also bonded to bond sites on the substrate 19 and the respective circuit connections are made by conventional wire bonding techniques. It should be understood, however, that some of the connections could equally well be formed directly on the substrate 19 by conventional photolithographic conductor-forming techniques.

THE VOLTAGE INDICATOR DEVICE

Referring again to FIG. 1, various details of the device 11 are more clearly understood relative to the above-described indicating circuit 21. The probe 13 is rigidly mounted in a tapered end 101 of the housing 12 and extends into a first cavity 102 of the housing. From this first cavity 102, a wired connection is made to the circuit 21, the connection corresponding to an extension of the input terminal 27 of the circuit.

A transverse divider 104 separates the first cavity 102 from a battery cavity 106. A circuit connector 105 is mounted to the divider 104. A wired connection from the connector 105 corresponds to an extension of the battery terminal 51 of the circuit in FIG. 2. The divider 104 acts as a stop for the battery 25 inserted in series into the battery cavity 106, such that a positive battery terminal 108 rests against the connector 105 in the divider 104. The rear of the battery cavity 106 is bounded by a divider 110. A spring 112 urges the batteries, two 1.5 volt N-type batteries, into contact with each other and establishes ground contact with the rearmost of the batteries 25. The pin 52 is coupled directly to the spring 112 and establishes contact with the connector plug 36 when it is inserted into the socket 37 at a flat end 115 of the device 11. A wire connection 117 corresponds to an extension of the reference terminal 38 of the circuit 21. The ground lead 14 is conveniently equipped with an alligator clip 130. Any other type of connector can, of course, be substituted therefor.

At the seat 17 near the tapered end 101 of the device 11, the substrate 19 is mounted into a cavity 119 formed by a ridge 121 about the seat 17. After the substrate is mounted into the cavity 119 with the light-emitting diodes 54, 61 and 72 facing outwardly, a protective cover 123 is placed over the substrate 19 to protect the components on the substrate 19 from physical damage. Three apertures 125, in the cover 123 line up with the three light-emitting diodes 54, 61 and 72 to allow their signal outputs to be viewed through the cover 123.

While the invention has been described with respect to the device 11, a detailed description should be viewed as being illustrative only and not limiting to the invention. Various changes can be made in the circuit 21 itself and in physical housing of the circuit without departing from the spirit and scope of the invention. The invention is to be limited only by the scope of the claims appended hereto.

What is claimed is:
1. A device for comparing and indicating the polarity of voltages with respect to a reference range about a reference voltage, which comprises:
    means for supporting electrical circuit elements;
    an input terminal located on the supporting means;
    a reference terminal located on the supporting means;
    a first circuit means, including a first indicator element located on the supporting means and coupled to the input terminal and to the reference terminal, for sensing and indicating the presence at the input terminal of a voltage applied to the input terminal which is at least as positive as a first voltage value, the first voltage value being positive with respect to the reference voltage applied at the reference terminal;
    a second circuit means, including a second indicator element located on the supporting means and coupled to the input terminal and to the reference terminal, for sensing and indicating the presence at the input terminal of a voltage applied to the input terminal which is at least as negative as a second voltage value, the second voltage value being negative with respect to the reference voltage applied at the reference terminal; and
    a third circuit means, including a third indicator element located on the supporting means and coupled to the input terminal and to the reference terminal for sensing and indicating the presence at the input terminal of a voltage applied to the input terminal which falls within the reference range, the reference range encompassing the first and the second voltage values.

2. A device according to claim 1, which comprises:
    means for supplying a battery voltage to the first, second and third circuit means, the respective indicators of each of the circuit means being coupled between the battery voltage supply means and the reference terminal; and
    first, second and third voltage responsive switches included in the first, second and third circuit means, respectively, and coupled between the battery voltage supply means and the reference terminal in series with the first, second and third indicators, respectively, to selectively activate the indicators in response to the application of respective voltages at the input terminal and at the reference terminal.

3. A device according to claim 2, wherein:
    the battery voltage supply means comprises a battery voltage terminal located on the supporting means;
    the third circuit means comprises a voltage divider coupled between the battery voltage terminal and the input terminal, the voltage divider having a node coupled to the third voltage responsive switch for supplying a voltage to the third switch to activate the third indicator when the voltage applied at the input terminal is more negative than an upper threshold voltage value, the upper threshold voltage value being more positive than the first voltage value; and
    an inhibiting means is coupled to the node of the third circuit means for altering the voltage supplied by the voltage divider to a value substantially that of the battery voltage, when a voltage applied at the input terminal is at least as negative as a lower threshold voltage value the lower threshold voltage value being more negative than the second voltage value.

4. A device according to claim 3, wherein the battery voltage supply means comprises a battery adapted to be coupled between the reference terminal and the battery voltage terminal.

5. A device according to claim 4 comprising:
    a housing for retaining the battery;
    a probe extending from the housing;
    the supporting means mounted to the housing, to visually expose the indicators on the supporting means; and
    a connector socket mounted to the housing and coupled to the reference terminal on the supporting means, the connector socket being adapted to accept a connector plug on a ground lead.

6. A device according to claim 5 further comprising:

a battery contact, coupled to one side of the battery, the battery contact being located adjacent the connector socket in the path of the connector plug inserted into the socket, such that an electrical continuity is established from the one side of the battery through the battery contact, the connector plug, the connector socket to the reference terminal on the substrate upon insertion of the connector plug into the socket.

7. A voltage comparator and indicator, which comprises:

a housing;

a probe connection carried by the housing;

a ground connection carried by the housing;

a circuit substrate mounted to the housing, the circuit substrate having located thereon an input terminal coupled to the probe connection, a reference terminal coupled to the ground connection, and a battery terminal;

a first circuit means, located on the substrate and coupled to the input terminal and to the reference terminal and including a first indicator, for sensing and indicating the presence at the probe connection of a voltage applied at the probe connection which is at least as positive as a first voltage value which is positive with respect to a ground potential at the ground connection;

a second circuit means, located on the substrate and coupled to the input terminal and to the reference terminal and including a second indicator, for sensing and indicating the presence at the probe connection of a voltage applied at the probe connection which is at least as negative as a second voltage value which is negative with respect to the ground potential at the ground connection;

a third circuit means, located on the substrate and coupled to the input terminal and to the reference terminal and including a third indicator, for sensing and indicating the presence at the probe connection of a voltage applied to the probe connection which lies within a range about the ground potential, the range including the first and the second voltage values, a battery voltage being applied to the battery terminal and coupled to the third circuit means to bias the third circuit means into continued operation when the voltage applied at the probe connection is substantially at ground potential.

* * * * *